United States Patent
Sahasrabudhe et al.

(10) Patent No.: US 8,102,038 B2
(45) Date of Patent: Jan. 24, 2012

(54) SEMICONDUCTOR CHIP ATTACH CONFIGURATION HAVING IMPROVED THERMAL CHARACTERISTICS

(75) Inventors: Kapil Heramb Sahasrabudhe, Dallas, TX (US); Jayprakash Vijay Chipalkatti, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 103 days.

(21) Appl. No.: 12/562,385

(22) Filed: Sep. 18, 2009

(65) Prior Publication Data

US 2011/0068446 A1  Mar. 24, 2011

(51) Int. Cl.
*H01L 23/495* (2006.01)
(52) U.S. Cl. ............... 257/676; 257/783; 257/E23.031; 257/E21.506
(58) Field of Classification Search .......... 257/737, 257/738, 778, 783, E23.021, E23.069, 666–676, 257/E23.031, E21.506; 438/123
See application file for complete search history.

(56) References Cited

U.S. PATENT DOCUMENTS

| | | | | |
|---|---|---|---|---|
| 5,616,517 | A * | 4/1997 | Wen et al. | 438/125 |
| 5,686,318 | A * | 11/1997 | Farnworth et al. | 438/15 |
| 7,187,066 | B2 * | 3/2007 | Frutschy | 257/678 |

FOREIGN PATENT DOCUMENTS

JP  58-218130  * 6/1982  ............ 257/777

* cited by examiner

*Primary Examiner* — Jasmine Clark
(74) *Attorney, Agent, or Firm* — Steven A. Shaw; W. James Brady; Frederick J. Telecky, Jr.

(57) ABSTRACT

A semiconductor chip 101 with surface 101*b* free of circuitry assembled on a metal carrier 102 by an attachment layer 103 with thickness 103*a*. Included in layer 103 are metal bodies 104 and an adhesive polymeric compound 105 between bodies 104. Metal bodies 104 form metal inter-diffusions with carrier 102 and extend from the carrier across thickness 103*a*, stopping at and contacting second chip surface 101*b*. The high thermal conductivity of metal bodies 104 greatly increases the thermal conductivity of the attachment layer. The metal bodies may be arrayed in a regularly spaced pattern in x- and y-directions, as well as in enhanced concentrations in locations of thermal hot spots and of high thermomechnical stresses. In the latter application, the metal bodies prevent the growth of microcracks and delamination.

21 Claims, 5 Drawing Sheets

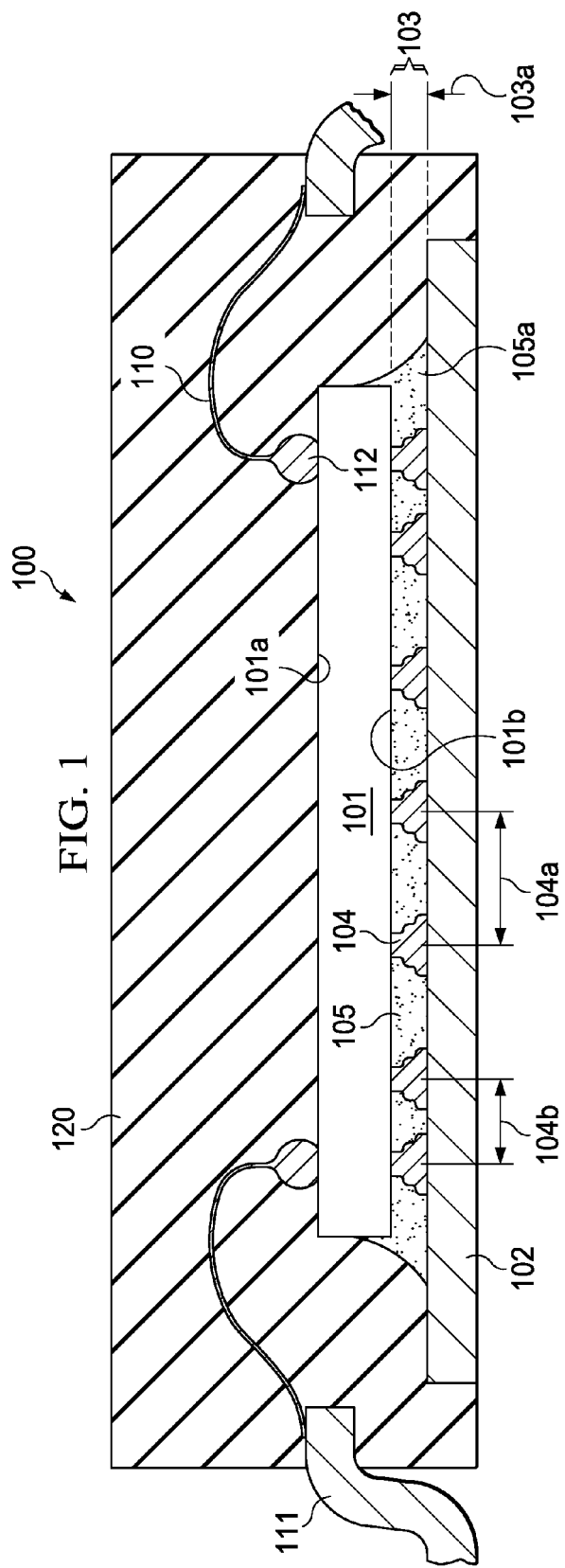
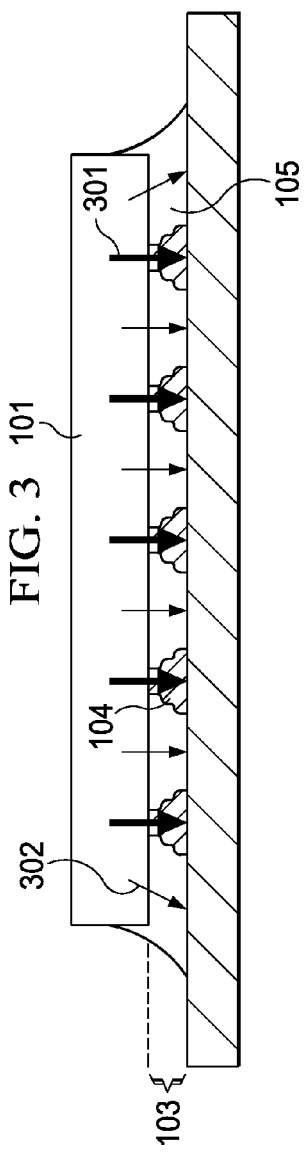

SEMICONDUCTOR CHIP ATTACH CONFIGURATION HAVING IMPROVED THERMAL CHARACTERISTICS

FIELD OF THE INVENTION

The present invention is related in general to the field of semiconductor devices and processes, and more specifically to the structure and fabrication method of thermally improved semiconductor devices having the chips attached to the metallic substrate by metal balls in addition to the metal-filled polymeric adhesive.

DESCRIPTION OF RELATED ART

Removing the thermal heat generated by active components during device operation belongs to the most fundamental challenges in integrated circuit technology. In order to keep the active components at their optimum (low) operating temperatures and speed, this heat must continuously be dissipated and removed to outside heat sinks. This effort becomes increasingly harder, the higher the energy density gets.

When a semiconductor chip includes the circuitry on one surface, the opposite surface is commonly attached to a carrier such as the metal pad of a leadframe or a substrate. The attachment is usually performed by an adhesive such as an epoxy-based or polyimide-based polymeric resin. The adhesive is applied as a low viscosity precursor, typically by using a syringe to drop a small resin volume onto the carrier. The chip is then pressed onto the spreading compound to form a layer typically between 50 and 80 µm thick. Thereafter, the resin is hardened by polymerization at elevated temperatures (150 to 220° C. for 20 to 30 min), known as the curing process.

The most effective approach to heat removal focuses on transport of the thermal energy from the circuitry through the chip thickness to the attachment surface and then through the adhesive precursor to the chip carrier, which is preferably fully metallic. In order to increase the thermal conductivity of the precursor, silver particles of a length between about 5 to 50 µm are finely distributed in the resin. The most suitable filling coefficient has been found to be between about 80 and 90 volume %, resulting in a compound thermal conductivity $\lambda$ typically between 3 to 6 W m$^{-1}$ K$^{-1}$. Due to the method of application, the silver particles are predominantly oriented horizontally so that the dispersed metal particles are connected only at small points and the interface between chip and compound and the interface between carrier and compound are resin-rich, contributing to the low effective thermal conductivity of the compound.

The steps of applying the low viscosity precursor, pressing the chip onto the compound, and hardening the precursor by polymerization are performed under tight process controls to ensure uniformity of the layer thickness and chemical composition. Unequal uniformity distributions have been found to be sensitive to thermomechanical stresses, fatigue, and the opening of microcracks, which eventually may lead to delamination of the chip from the carrier.

SUMMARY OF THE INVENTION

Applicants recognized that the ever shrinking component feature sizes and increasing density of device integration, coupled with an ever increasing device speed and density of power (for example on a power FET, field effect transistor) are resulting in a thermal energy generation, which can no longer be reliably removed by the low thermal conductivity of the polymeric compound layer between chip and carrier. Applicants realized, however, that a filler loading higher than 90 volume %, while increasing the probability of metal to metal contact and thus improving the compound thermal conductivity, would lower the adhesive content and thus reduce the mechanical bonding strength, and would result in higher viscosity leading to dispensing challenges.

Applicants further found that the simple replacement of the adhesive resin layer by a solder layer of tin ($\lambda_{Sn}$ 67 W m$^{-1}$ K$^{-1}$) or of eutectic gold/germanium alloy (12.5 weight % Ge, $\lambda_{Au}$ 317 W m$^{-1}$K$^{-1}$, $\lambda_{Ge}$ 60 W m$^{-1}$K$^{-1}$) leads to unacceptable microcracking of the layer and delamination of chip and carrier. In addition, metallic chip attach layers are more expensive than metal-filled epoxy materials and require back side metallization of the chips.

Applicants solved the problem of greatly increasing the thermal conductivity of the chip-to-carrier attachment layer and simultaneously avoiding microcracks and delamination, by first attaching across the carrier area an array of metal bodies, preferably made of copper ($\lambda_{Cu}$ 401 W m$^{-1}$K$^{-1}$) or of gold ($\lambda_{Au}$ 317 W m$^{-1}$K$^{-1}$), and then filling the space between these bodies with the silver-filled adhesive compound. When the chip surface opposite to the circuitry-carrying surface is attached to the adhesive, the circuitry-free chip side gets in contact with the metal bodies, which stop at the circuitry-free chip side.

The array of metal bodies may be created by automated wire bonders, which form free air balls from copper wire or gold wire at the tip of a capillary and press the hot balls against the carrier surface for attachment, in the process forming metal interdiffusions between balls and carrier and forming tapered metal bodies resembling truncated cones. After wire break-off, a coining process flattens the body breakage area. The pattern of the array is controlled by the bonder computer and can thus easily be customized for different device types. A preferred pattern includes coined bodies spaced regularly in x- and y-directions in order to dramatically increase the thermal conductivity of the attachment layer generally.

Additional preferred patterns include locally enhanced body concentrations at spots identified of having high stress (such as chip corners) or high temperatures (hot spots of the operating integrated circuit). For the metal body concentrations at high stress spots, applicants have discovered that microcracks in the adhesive, which might originate for instance at the assembly corners, are regularly deflected or outright stopped at the metal bodies. Consequently, concentrations of metal bodies in chip corners make the assembly robust against delamination.

For the metal body concentrations at hot spots of the operating circuit, applicants demonstrated the local cooling effect and thus the prevention of the dreaded second breakdown phenomenon (leading to destructive local melting of silicon) caused by local thermal runaway.

BRIEF DESCRIPTION OF THE DRAWINGS

FIG. 1 shows a schematic cross section of a semiconductor device according to the invention, the device having the chip attached to a (metallic) carrier by layer of an adhesive polymeric compound and an array of metal bodies for transferring heat and stopping microcracks.

FIG. 3 shows a schematic cross section of a semiconductor device illustrating the flow of thermal energy through the chip attach layer.

DETAILED DESCRIPTION OF THE PREFERRED EMBODIMENTS

Figure 2:
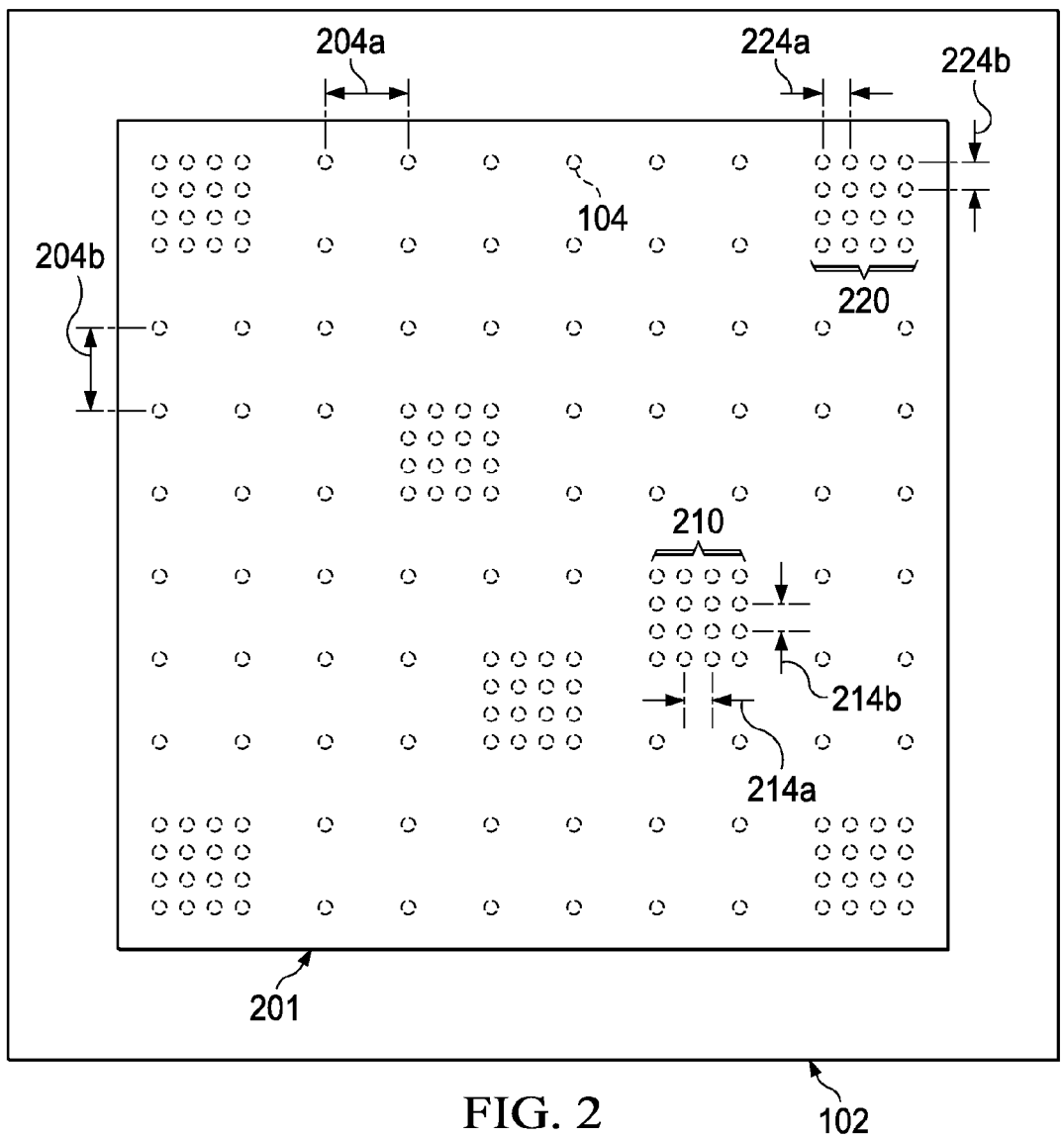
FIG. 2 illustrates a schematic top view of a semiconductor device carrier with metal bodies attached in an array according to the invention, the array including a regularly spaced pattern in x- and y-directions as well as enhanced concentrations in locations of thermal hot spots and high thermomechanical stresses.

FIG. 1 illustrates an exemplary semiconductor device, generally designated 100, exhibiting features of the present invention. Specifically, the example of FIG. 1 may be a power device. A semiconductor chip 101 has a first surface 101a with the integrated circuit and an opposite second surface 101b free of circuitry. The second surface 101b is assembled on a metallic carrier 102 by an attachment layer 103, which has a thickness 103a. Included in layer 103 are metal bodies 104 and an adhesive polymeric compound 105 between bodies 104. Metal bodies 104 extend from the metal carrier 102 to the second chip surface 101b, stop at the second surface, and are in thermal contact both with the chip and the carrier. The adhesive polymeric compound 105 extends between the bodies 104, filling the space of thickness 103a between chip and carrier, and preferably forms a meniscus 105a along the chip edges.

FIG. 1 indicates that the terminals of the chip circuitry on surface 101a are connected by metal wires 110 to the leads 111 for external connections, for instance the leads of a leadframe. Wires 110 have a preferred thickness between about 18 and 33 μm and are connected to the chip terminals by balls 112, created by the ball bonding methodology (see below). For protection of the circuitry and the thin wires 110, the assembled chip is encapsulated in compound 120, preferably an epoxy-based molding compound filled with inorganic filler particles. Carrier 102 is preferably the metallic chip-attachment pad of a leadframe, which is preferably made of a copper alloy. Alternatively, carrier 102 may be any substrate of high thermal conductivity, preferably with a metalized surface.

As FIG. 1 shows, chip 101 is oriented so that the active circuitry is located on surface 101a, opposite to the circuitry-free surface 101b, which is in contact with attachment layer 103. When the circuitry is operating, the active components create heat, and removing the thermal energy belongs to the most fundamental challenges in integrated circuit technology. The thermal flux Q per unit time traverses first the thickness of the semiconductor chip, which has high thermal conductivity, and then has to be transported through the thickness 103a of the attachment layer 103. Q is equal to the product of thermal conductivity λ multiplied by the gradient of temperature T, in the direction of decreasing temperature, and by the area q perpendicular to the temperature gradient:

$$dQ/dt = -\lambda \cdot (\text{grad } T) \cdot q.$$

The thermal flux Q is in the direction of the temperature difference and is proportional to the magnitude of that difference and to the thermal conductivity λ, a materials characteristic. When, over the length l, the temperature drop is steady and uniform from the high temperature $T_2$ of the active circuitry to the low temperature $T_1$ the carrier, then (grad T) reduces to $(T_2-T_1)/l$:

$$dQ/dt = -\lambda \cdot (q/l) \cdot (T_2-T_1).$$

λ·(q/l) is called the thermal conductance, and the inverse value l/(λ·q) is called thermal resistance. In the present invention, the improvement of λ·q is provided by the high thermal conductivity of the metal bodies 104 distributed over the geometry of the attachment area. Improved thermal conductivity λ results in enhanced thermal flux vertically away from the heat-generating active components on the active surface 101a of the semiconductor chip 101.

The adhesive polymeric compound 105 is preferably an epoxy-based formulation; it includes finely distributed silver particles of a length between 5 and 50 μm as fillers in a concentration between about 80 and 90 volume %. The resulting thermal conductivity of the compound is between about 3 and 6 W m$^{-1}$K$^{-1}$. In contrast, the thermal conductivity of the metal for bodies 104 is approximately two orders of magnitude higher. Preferred metal choices for bodies 104 include copper with the thermal conductivity $\lambda_{Cu}$=401 W m$^{-1}$K$^{-1}$; gold with the thermal conductivity $\lambda_{Au}$=317 W m$^{-1}$K$^{-1}$; silver with the thermal conductivity $\lambda_{Ag}$=429 W m$^{-1}$ K$^{-1}$; aluminum with the thermal conductivity $\lambda_{Al}$=237 W m$^{-1}$K$^{-1}$; and alloys of these and other metals with interim thermal conductivity values.

As stated above, metal bodies 104 are in contact both with carrier 102 and the chip surface 101b free of circuitry (in addition, they form metal interdiffusions with the carrier metal). Consequently, the height of metal bodies 104 determines the thickness 103a of the attachment layer 103. When bodies 104 are fabricated by the wire ball-bonding method well known in semiconductor technology (see below), the preferred layer thickness 103a is in the range from about 35 to 70 μm.

The example of FIG. 1 indicates that the distance center-to-center between adjacent metal bodies 104 may have one value 104a for some bodies, but a different value 104b for other bodies. This feature is shown in more detail in FIG. 2, which displays the distribution of metal bodies 104 across the whole area 201 of carrier 102 covered by the attached chip. It is a technical advantage when one set of metal bodies is arrayed in a regularly spaced pattern in x- and y-directions, because the regularly spaced pattern of bodies 104 provides a thermal conductivity for the attachment layer significantly higher than the thermal conductivity of the adhesive polymeric compound filling the bulk of the attachment layer. In FIG. 2, the pitch in x-direction is designated 204a and the pitch in y-direction is designated 204b. In FIG. 2, the pitch 204b is identical to the pitch 204a, but in other devices pitch 204b may be different from pitch 204a.

It is an additional technical advantage when another, additional set of metal bodies is arrayed in locally enhanced concentrations. As shown in FIG. 2, one additional group 210 of locally enhanced concentrations may be in locations of thermal hot spots, which vary from device type to device type and are identified in advance by thermal modeling of the circuit operation of each device type. For group 210, the pitch 214a of metal bodies in x-direction may be the same as the pitch 214b in y-direction, or it may be different. The placement of metal bodies with their high thermal conductivity directly under the circuit hot spots provides an excellent local cooling effect and thus prevents the dreaded second breakdown phenomenon, which is caused by local thermal runaway and may initiate destructive local re-melting of silicon.

FIG. 3 illustrates schematically the thermal flux through the attachment layer 102 in the presence of the metal bodies. The strong arrows 301 indicate the thermal flux through the metal bodies 104, and the weak arrows 302 indicate the thermal flux through the metal-filled adhesive polymer compound 105. As stated above, the thermal conductivity of the metal bodies is approximately hundred times higher than the thermal conductivity of the metal-filled polymer compound.

Referring to FIG. 2, another, additional group 220 of locally enhanced metal body concentrations may be in locations of high thermomechanical stresses. Prime examples of very high stress locations are the corners of attached semiconductor chips. FIG. 2 depicts additional, enhanced metal body concentration groups 220 on the carrier in all four corners of the area, which will be covered by the attached chip. For group 220, the pitch 224a of metal bodies in x-direction may be the same as the pitch 220b in y-direction, or it may be different. Further, the pitches 214a, 214b, 224a, and 224b may be identical or may be different. The technical advantage of metal bodies in high stress spots is based on the observation that microcracks in the hardened adhesive compound, which might originate for instance at the assembly corners, are regularly deflected or outright stopped at the metal bodies. Consequently, concentrations of metal bodies in chip corners make the assembly robust against delamination.

Figure 4:
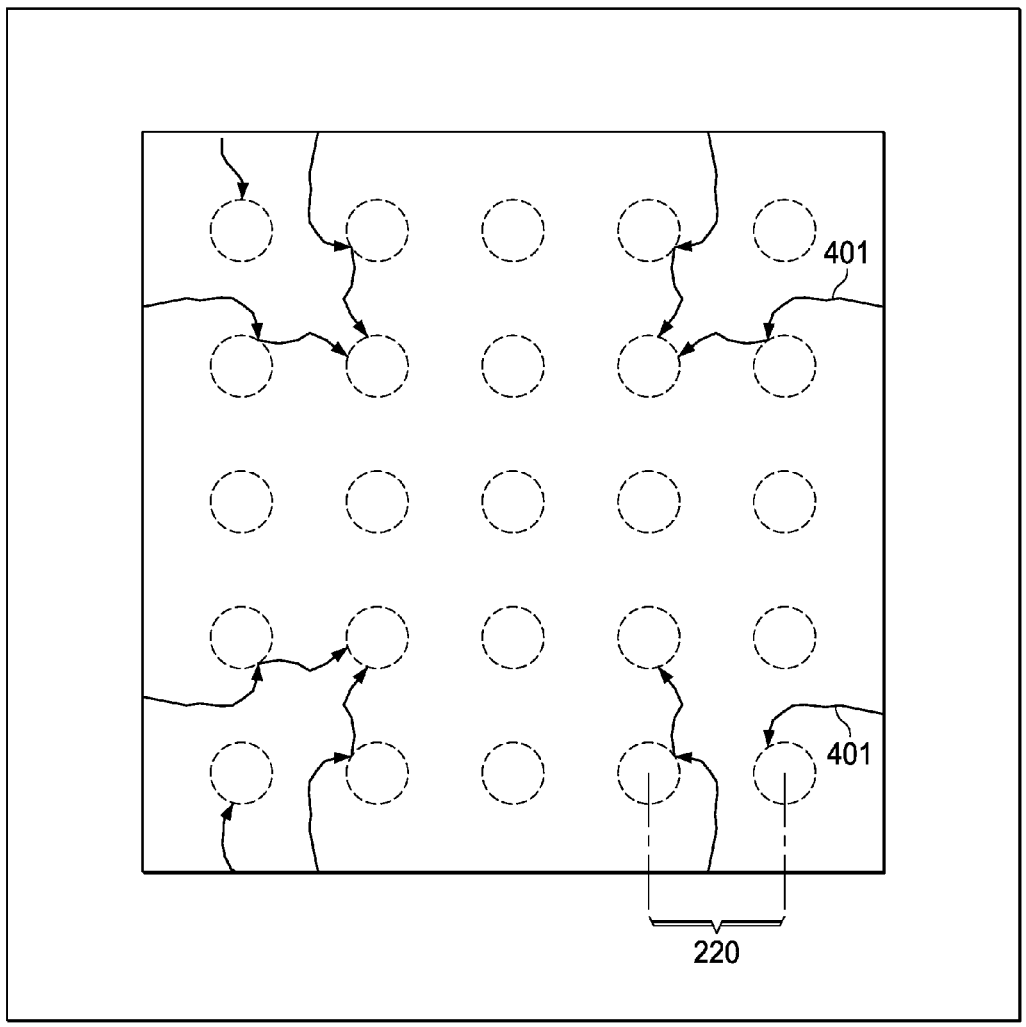
FIG. 4 is a schematic top view of a semiconductor device carrier with attached metal bodies and a polymeric adhesive compound, illustrating the deflection and stoppage by the metal bodies of microcracks in the compound or at the compound-to-metal-carrier interface.

This technical advantage is schematically depicted in FIG. 4. Nascent microcracks are indicated by the arrows 401 originating at the edges of the hardened attachment compound. According to the energy-balance concept for crack formation in brittle solids, a change in the length of a nascent crack or notch cannot change the sum of all energies; in other words, the sum of surface energy and mechanical energy has to stay constant. This means for a crack extension that the surface energy may generally increase, but the mechanical energy has to decrease. The mechanical energy itself consists of the sum of the strain potential energy stored in the material and the potential energy of the outer applied loading system. This says, whenever any of these energies can assume a lower value, the freed energy can be invested in generating more surface for an expanding crack.

Whenever stress is applied, for instance during device operation or testing of the semiconductor device, so that it is larger than the failure stress, a nascent crack (401 in FIG. 4) may propagate spontaneously and without limit—unless it is stopped or arrested. The failure stress at the crack front, in turn, is proportional to the free surface energy per unit area and to Young's modulus (a material constant), and inverse proportional to the length of the starter crack or notch.

The present invention includes the fabrication of clusters of metal bodies in regions of high thermomechanical stresses in order to transform the hardened attachment compound into reinforced composites with considerable toughness against fracture and propagation of nascent cracks. The main contribution to this toughness comes from the intrinsic adhesion energies of the components. The toughening is attributable to shielding processes, notably bridging, where the reinforcing phases are left intact as ligaments at the crack interface. Effective toughening is based on the existence of suitably weak interfaces to allow debonding between the insulators and the reinforcing metal structures, and energy dissipation within the ensuing bridges at separation. Tolerance against large stress and strain to failure has been observed, with the crack resistance energy per unit area increasing up to an order of magnitude.

If a crack were able to penetrate the first line or row of metal bodies in the cluster 220 next to the chip edge by breaking through a weak flaw, or due to rupturing of the metal body, it would loose its energy in debonding and would be arrested by one of the next bodies. With these metal bodies in the cluster 220, the hardened compound can preserve its stiffness, but the metal structures enhance toughness and energy absorption capacity. If no full-scale plastic zone develops about the crack tip, the shielding is predominantly associated with dissipation of plastic energy at the metal across the crack interface.

Detailed modeling confirmed the benefit of metal bodies in the attachment layer for lowering of the device temperature by improved thermal conductance and for avoiding microcracks and chip delamination. As an example, for chip attach with standard adhesive polymeric compounds, several locations of a chip may reach 130° C. during operation. After inserting metal bodies in clusters where operating hot spots appeared, no chip location reached a temperature higher than 117° C. This temperature could be lowered by adding metal bodies in an array of regular pattern. Thermomechanical stress was significantly reduced, and in no location were delaminations observed between chip and carrier.

Figure 5:
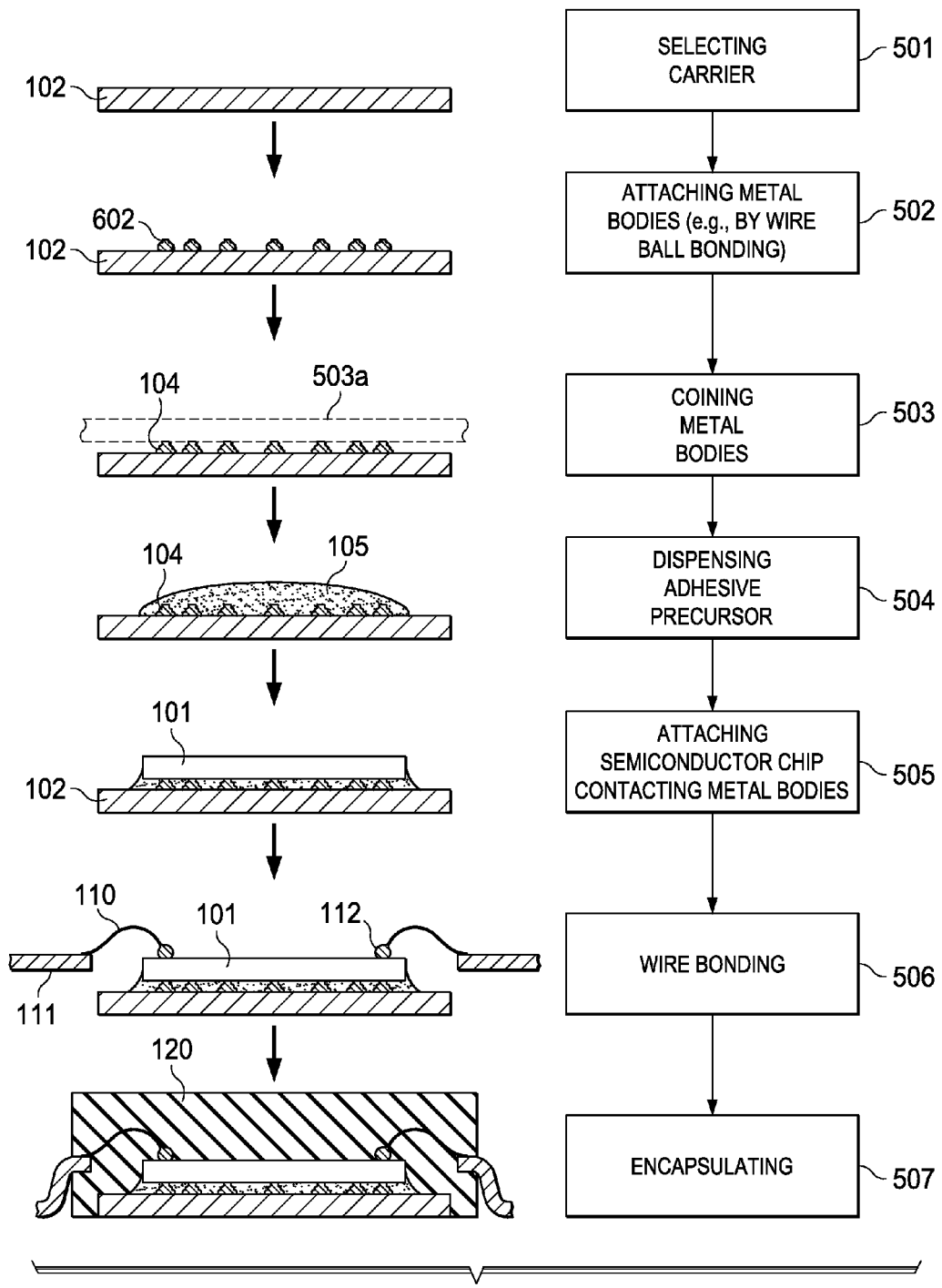
FIG. 5 shows schematically the flow of certain process steps of the method for fabricating a semiconductor device with enhanced thermal conductivity of the attachment layer as an embodiment of the invention.

Another embodiment of the invention is a method for attaching a chip to a carrier to maximize the thermal device characteristics. Certain process steps of the method are listed in FIG. 5. The method starts in step 501 by selecting a carrier 102, preferably the chip attach pad of a metallic leadframe, alternatively a metalized portion of a substrate with high thermal conductivity. In step 502, an array of metal bodies 602 (which will become metal bodies 104, 210, and 220 in FIG. 2) is attached to carrier 102. The preferred process for creating the metal bodies 602, indicated in FIG. 5 by a modified wire bonding technique, is described below.

In process step 503, the metal bodies 602 are coined to ensure uniform height of the bodies and a flattened body surface; the coined bodies have been designated 104. In the coining process, the coining tool, designated 503a, is preferably a stiff, flat board or a stamper, preferably made of tungsten stainless steel with a titanium/tungsten coating. The toll is placed horizontally over the array of bodies. Then, the tool is pressed onto the array to create a flat end for all bodies and concurrently ensure uniform height for all bodies of the array. In a modified coining process, each freshly formed metal body is coined individually right after its formation step.

In step 504, a polymeric adhesive precursor 105 (for example, an epoxy-based formulation) is disposed onto the array of metal bodies in a quantity to fill the space between the bodies; in a preferred method, one or more precursor drops are dispensed from a syringe. In step 505, the semiconductor chip 101 is attached to the adhesive precursor so that the circuit-free chip surface 101b is in contact with the flattened surface of the arrayed metal bodies. In this step, the low-viscosity precursor is slightly pressed sidewise, where it forms a meniscus along the chip edges. Finally, the adhesive polymeric precursor is hardened by the process of polymerization at elevated temperatures for a certain length of time (for instance, at about 220° C. for about 20 min).

In step 506, electrical connections from the circuit terminals on chip surface 101a to the leads 111 are created by the ball wire bonding technique creating balls 112 and spanning wires 110. In step 507, an encapsulation method (preferably a molding technique) creates a protective package 120 for chip and bonding wires.

Figure 6:
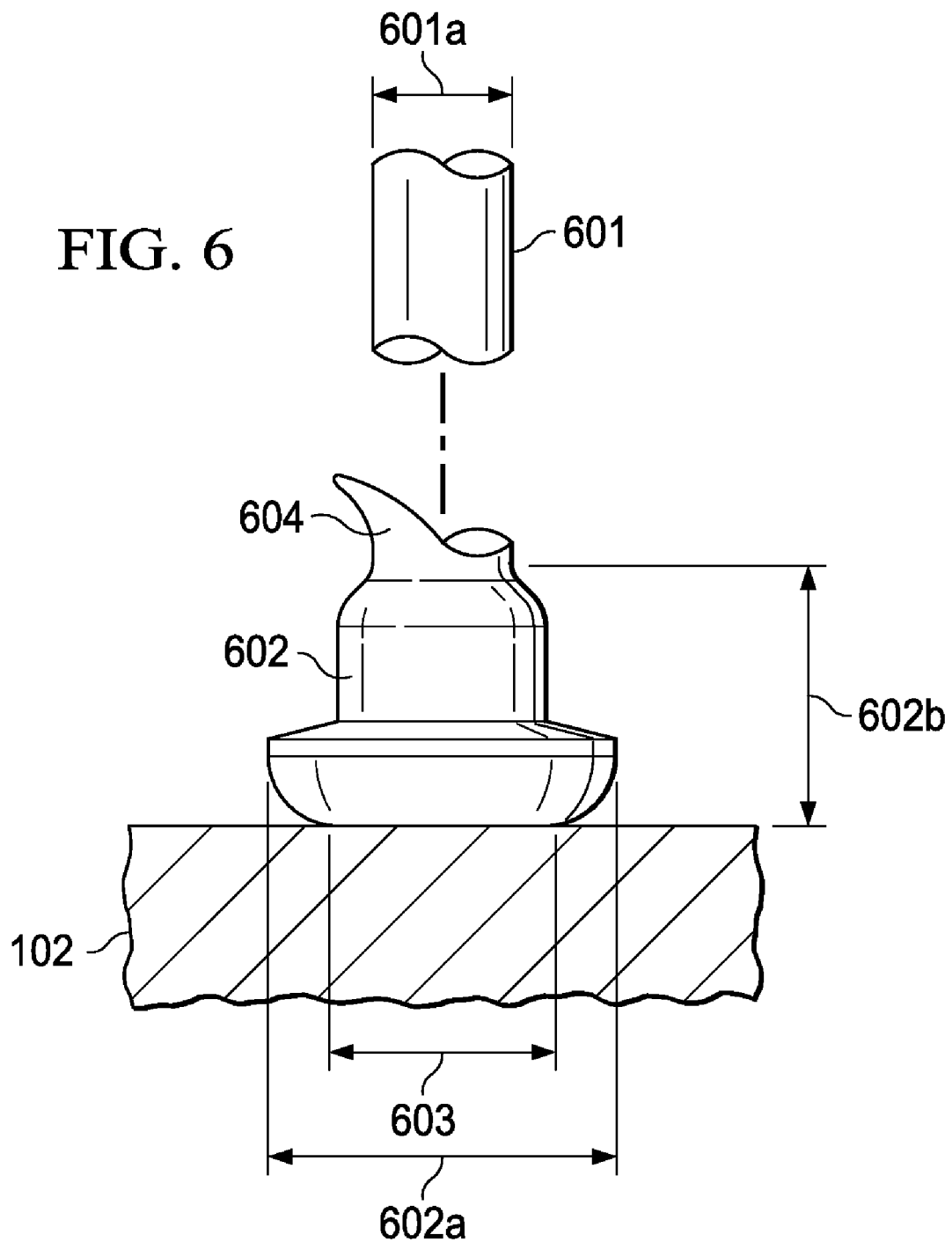
FIG. 6 is a schematic cross section of a squeezed spheroid metal body, resembling a truncated cone, created by wire bonding technology as an embodiment of the computer-controlled methodology to fabricate customized array patterns of the metal bodies.

A preferred method of fabricating the metal bodies 104, 210 and 220 is a modified wire bonding technique; the result of the method is summarized in FIG. 6. A round wire 601 in the preferred thickness range from about 18 to 33 µm is selected from a group of metals including copper, gold, silver, and aluminum. The metal body formation begins by positioning the carrier 102 (for example, the pad of a leadframe) on a heated pedestal to raise the temperature to between 150 and 300° C. Using a computer-controlled wire bonder, the wire is strung through a capillary so that a wire portion protrudes from the capillary nozzle. At the tip of the wire, a free air ball is created using either a flame or a spark technique to melt a portion of the wire. The ball has a typical diameter from about 1.2 to 1.6 wire diameters. The capillary is moved towards the carrier and the (still hot and soft) ball is pressed against the carrier 102 for attaching it to the carrier, while concurrently squeezing the ball into the shape of a tapered body resembling a truncated cone; the body shows the imprint of the capillary tip. Preferably, a combination of compression force and ultrasonic energy creates the formation of a strong metallurgical bond to the carrier metal by interdiffuison between the metals of the body and the carrier. As an example, the compression (also called Z- or mash) force is between about 17 and 75 g; the ultrasonic time between about 10 and 20 ms; the ultrasonic power between about 20 and 50 mW. At time of bonding, the temperature usually ranges from 150 to 270° C. Finally, the capillary is raised and moved sidewise in order to break off the wire in the heat-affected zone, which is mechanically weak.

At this stage, the metal body may look like the schematic representation shown in FIG. 6. Wire 601, preferably selected from copper, gold, silver, aluminum, or alloys of these metals, has a diameter 601a, preferably between about 18 to 33 µm. The truncated cone 602 has a bottom diameter 602a preferably between 2.5 and 3 times the wire diameter, bottom diameter tapers towards the top of the cone. The cone height 602b is about twice the wire diameter. Preferably, height 602b is between about 35 and 70 µm; selecting thinner wires, smaller heights 602b can be produced, and selecting thicker wires, taller heights 602b are feasible. The diameter 603 of the contact to carrier 102 of body 602 is usually more than 1.5 times the wire diameter. The top portion 604 is a remnant of the wire after the break-off by the capillary. Portion 604 is soft since it originates from the mechanically weak heat-affected wire zone and will be flattened in the process step of coining by a flat board or stamping tool mentioned above. The flattened top of the metal body is intended for contact to the circuitry-free surface of the semiconductor chip.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, when the metal bodies are created by a wire ball bonding technique, the size of the bodies may be equal to, or smaller than, or larger than the ball size used for the electrical connection of the chip terminals. The metal bodies can thus follow the need for scaling of device feature sizes. As an another example, using finite element modeling of thermal hot spots and thermomechanical stresses for each circuit type, strategically placed concentrations of metal bodies can ensure effective cooling as well as avoidance of delamination especially in power devices; the metal bodies thus promote high device reliability. It is therefore intended that the appended claims encompass any such modifications or embodiments.

We claim:

1. An apparatus comprising:
   a semiconductor chip having a first surface including circuitry and an opposite second surface free of circuitry;
   the second surface assembled on a metal carrier by an attachment layer having a thickness; and
   the attachment layer including metal bodies and an adhesive polymeric compound;
      the bodies forming metal inter-diffusions with the carrier and extending from the carrier across the layer thickness, stopping at and contacting the second chip surface; and
      the adhesive polymeric compound between the bodies filling the space between the second surface and the carrier.

2. The apparatus of claim 1 wherein the metal carrier is the chip attach pad of a leadframe.

3. The apparatus of claim 2 further including bonding wires connecting the circuitry on the first chip surface to the leads of the leadframe.

4. The apparatus of claim 1 wherein the diameter of the metal bodies tapers from a wider end to the opposite narrower end, the wide end being in contact with the carrier and the narrow end in contact with the second chip surface.

5. The apparatus of claim 4 wherein the tapered metal bodies have a flat surface on the narrow end of the body, the flat surface stopping at and contacting the second, circuitry-free, chip surface.

6. The apparatus of claim 1 wherein the metal bodies are arrayed in a regularly spaced pattern in x- and y-directions.

7. The apparatus of claim 6 further including additional metal bodies arrayed in locally enhanced concentrations.

8. The apparatus of claim 7 wherein the enhanced body concentrations are in locations of thermal hot spots.

9. The apparatus of claim 7 wherein the enhanced body concentrations are in locations of high thermomechanical stresses.

10. The apparatus of claim 1 wherein the metal bodies include at least one metal selected from a group including copper, gold, silver, and aluminum.

11. The apparatus of claim 1 wherein the adhesive polymer compound includes metallic filler particles having a size smaller than the metal bodies.

12. The apparatus of claim 11 wherein the metallic filler particles include silver.

13. An apparatus comprising:
   a semiconductor chip having a first surface including circuitry and an opposite second surface free of circuitry;
   a substrate having a metal pad;
   metal bodies diffused in the metal pad and contacting the second surface of the semiconductor chip.

14. The apparatus of claim 13, wherein the metal bodies have tapered shape with a wider end at the metal pad and a narrower end at the semiconductor chip.

15. The apparatus of claim 14, wherein the tapered metal bodies have a flat surface contacting the semiconductor chip.

16. The apparatus of claim 13 wherein the metal bodies are arrayed in a rectangular pattern.

17. The apparatus of claim 16, wherein the array is disposed at each of four corners of the semiconductor chip.

18. The apparatus of claim 16, wherein the array is disposed at a thermal hot spot.

19. The apparatus of claim 13, wherein the metal bodies include at least one metal selected from a group including copper, gold, silver, and aluminum.

20. The apparatus of claim 13 further comprising adhesive polymer compound and metallic filler particles having a size smaller than the metal bodies.

21. The apparatus of claim 20, wherein the metallic filler particles include silver.

* * * * *